United States Patent
Gao

(10) Patent No.: US 9,608,402 B2
(45) Date of Patent: Mar. 28, 2017

(54) PACKAGING STRUCTURE AND METHOD OF PACKAGING TUNABLE LASER DEVICE, AND TUNABLE LASER DEVICE

(71) Applicants: HISENSE BROADBAND MULTIMEDIA TECHNOLOGIES CO., LTD., Qingdao (CN); HISENSE USA CORPORATION, Suwanee, GA (US); HISENSE INTERNATIONAL CO., LTD., Qingdao (CN)

(72) Inventor: Zhenqiu Gao, Qingdao (CN)

(73) Assignees: HISENSE BROADBAND MULTIMEDIA TECHNOLOGIES CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

(21) Appl. No.: 15/169,436

(22) Filed: May 31, 2016

(65) Prior Publication Data

US 2016/0276802 A1    Sep. 22, 2016

Related U.S. Application Data

(63) Continuation-in-part of application No. 14/666,705, filed on Mar. 24, 2015, now Pat. No. 9,379,518.

(30) Foreign Application Priority Data

Aug. 28, 2014 (CN) .......................... 2014 1 0433096

(51) Int. Cl.
*H01S 5/02* (2006.01)
*H01S 5/022* (2006.01)
*H01S 5/024* (2006.01)
*H01S 5/026* (2006.01)
*H01S 5/125* (2006.01)
*H01S 5/068* (2006.01)
*H01S 5/042* (2006.01)
*H01S 5/00* (2006.01)
*H01S 5/06* (2006.01)
*H01S 5/0683* (2006.01)

(52) U.S. Cl.
CPC .......... *H01S 5/02212* (2013.01); *H01S 5/026* (2013.01); *H01S 5/02248* (2013.01); *H01S 5/02415* (2013.01); *H01S 5/02469* (2013.01); *H01S 5/042* (2013.01); *H01S 5/068* (2013.01); *H01S 5/125* (2013.01); *H01S 5/005* (2013.01); *H01S 5/0071* (2013.01); *H01S 5/02438* (2013.01); *H01S 5/0612* (2013.01); *H01S 5/0683* (2013.01)

(58) Field of Classification Search
None
See application file for complete search history.

*Primary Examiner* — Armando Rodriguez
(74) *Attorney, Agent, or Firm* — Harness, Dickey & Pierce, P.L.C.

(57) ABSTRACT

The present disclosure provides a packaging structure and a method of packaging an tunable laser device, and an tunable laser device. The packaging structure of the tunable laser device may include a TO tube base and a TO tube cap, wherein a first thermal sink is disposed on the TO tube base, a semiconductor laser chip is disposed on a vertical side of the first thermal sink, an aspheric lens is disposed on the TO tube cap, and the semiconductor laser chip is disposed on a central axis of the aspheric lens; and wherein the vertical side of the first thermal sink is a side of the first thermal sink perpendicular to the TO tube base. The tunable laser device according to the present disclosure may be applicable to communication over an optical fiber.

13 Claims, 5 Drawing Sheets

301   302   303

US 9,608,402 B2

PACKAGING STRUCTURE AND METHOD OF PACKAGING TUNABLE LASER DEVICE, AND TUNABLE LASER DEVICE

CROSS-REFERENCE TO RELATED APPLICATIONS

This application is a continuation-in-part of U.S. patent application Ser. No. 14/666,705, which claims priority to Chinese Patent Application No. 201410433096.0 filed Aug. 28, 2014. The entire disclosures of each of the above applications are incorporated herein by reference.

FIELD

The present disclosure relates to the technical field of laser devices and particularly to a packaging structure and a method of packaging a tunable laser device and a tunable laser device.

BACKGROUND

Laser has been widely applied in optical fiber communication systems, due to its high directivity, high coherence, high monochrome and other significant advantages. At present, laser is typically generated by a laser device at a constant wavelength, which can only generate laser at the constant wavelength, but there is an increasing demand for laser at different wavelengths in the optical fiber communication systems, due to the development of Dense Wavelength Division Multiplexing (DWDM) technology, so that a large number of laser devices at the different constant wavelengths have to be provided, thus resulting in a growing number of laser devices and an increase in cost thereof.

SUMMARY

In an aspect, an embodiment of the present disclosure provides a packaging structure of a tunable laser device, including: a TO tube base; a TO tube cap; a thermoelectric cooler disposed on the TO tube base; a first thermal sink disposed on the thermoelectric cooler; a semiconductor laser chip, a backlight monitor and a temperature sensor, disposed on the first thermal sink; an aspheric lens disposed on the TO tube cap; and a Distributed Bragg Reflector disposed in the semiconductor laser chip.

In another aspect, an embodiment of the present disclosure provides a method for packaging a tunable laser device, and the tunable laser device includes: a semiconductor laser chip, a thermoelectric cooler, a first thermal sink, a backlight monitor, a temperature sensor, an aspheric lens, a TO tube base, and a TO tube cap, and a Distributed Bragg Reflector disposed in the semiconductor laser chip, the packaging method including:

adhering the thermoelectric cooler on the TO tube base through eutectic soldering or high thermal conductivity glue;

adhering the first thermal sink on the thermoelectric cooler through eutectic soldering or high thermal conductivity glue;

adhering the semiconductor laser chip, the backlight monitor and the temperature sensor on the first thermal sink through eutectic soldering or high thermal conductivity glue;

connecting the above components with pins of the TO tube base through gold-wire soldering;

soldering the aspheric lens on the TO tube cap; and soldering the TO tube cap soldered with the aspheric lens on the TO tube base through resistance welding.

In still another aspect, an embodiment of the present disclosure provides a tunable laser device including a packaging structure including a TO tube base; a TO tube cap; a thermoelectric cooler disposed on the TO tube base; a first thermal sink disposed on the thermoelectric cooler; a semiconductor laser chip, a backlight monitor and a temperature sensor, disposed on the first thermal sink; an aspheric lens disposed on the TO tube cap; and a Distributed Bragg Reflector disposed in the semiconductor laser chip.

BRIEF DESCRIPTION OF THE DRAWINGS

In order to describe more clearly the technical solutions according to some embodiments of the present disclosure, the drawings to which reference is made in the description of the embodiments or the prior art will be described below briefly, and apparently the drawings described below are merely illustrative of some of the embodiments of the present disclosure, and those ordinarily skilled in the art can further derive other drawings from these drawings without any inventive effort.

DETAILED DESCRIPTION OF THE EMBODIMENTS

The technical solutions according to some embodiments of the present disclosure will be described below with reference to the drawings in embodiments of the present disclosure, and apparently embodiments described here are merely a part but not all of embodiments of the present disclosure. All the other embodiments which can occur to those ordinarily skilled in the art based upon embodiments of the present discourse without any inventive effort shall fall into the scope of the present disclosure as claimed.

Figure 1:
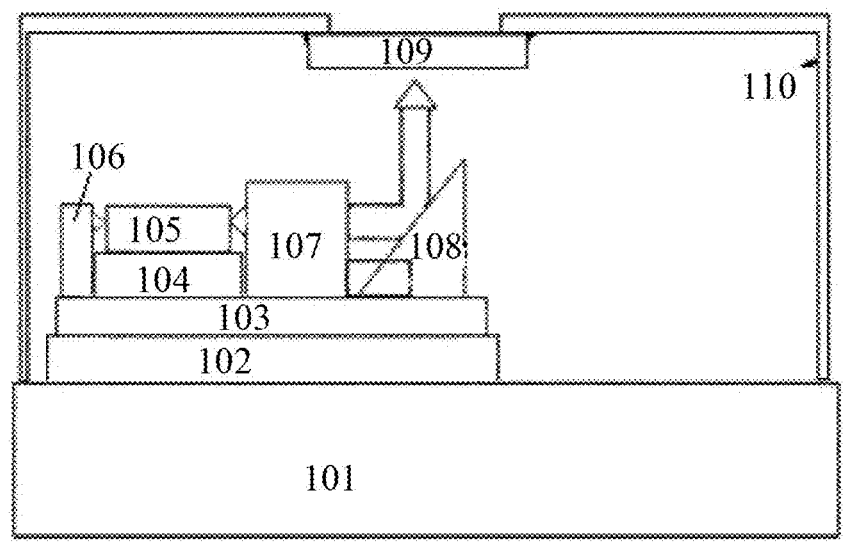
FIG. 1 illustrates a schematic diagram of a packaging structure inside a wavelength-adjustable semiconductor laser device.

In order to address the problem of a large number of laser devices at different constant wavelengths to be provided in an optical fiber communication system, an embodiment of the present disclosure provides a wavelength-adjustable semiconductor laser device, and FIG. 1 illustrates a schematic diagram of a packaging structure of the wavelength-adjustable semiconductor laser device. Forward light of a semiconductor laser chip 105 passing through an aspheric lens 107 is turned into a collimated spot, and the collimated spot reflected by a right-angled lens 108 is changed in direction by 90°, and then exits from a window film 109 on the surface of a TO tube cap 110 in the direction perpendicular to a TO tube base 101. Backward light of the semiconductor laser chip 105 is projected directly onto an photoelectric diode 106, to detect output power of the semiconductor laser chip 105; and a thermally conductive sheet 104 is configured to ensure the forward optical center of the semiconductor laser chip 105 and the center of the aspheric lens 107 to be located on the same horizontal line, i.e., collimated coaxially. The optical elements above are placed sequentially on a platform 103, and then on a thermoelectric cooler (TEC) 102, and finally the thermoelectric cooler 102 is placed on the upper surface of the TO tube base 101, and the TO tube cap 110 and the TO tube base 101 are adhered together by an adhesive, thus a packaging structure of the wavelength-adjustable semiconductor laser device is formed.

However, the inventors have identified that in the process of packaging the wavelength-adjustable semiconductor laser device, the forward light of the semiconductor laser chip 105 is converged, by the aspheric lens 107, into the collimated spot, and only after being refracted by the right-angled lens 108, can the collimated spot exit perpendicular to the direction of the TO tube base 101; that is, the forward light of the semiconductor laser chip 105 can exit perpendicularly only after being refracted by the right-angled lens 108.

Embodiments of the present disclosure provide a packaging structure and a method of packaging a tunable laser device, and a tunable laser device.

Some embodiments of the present disclosure provide a packaging structure and a method of packaging a tunable laser device, and a tunable laser device, and the packaging structure includes a TO tube base and a TO tube cap, a first thermal sink disposed on the TO tube base, a semiconductor laser chip disposed on a vertical side of the first thermal sink, and an aspheric lens disposed on the TO tube cap, herein the semiconductor laser chip is disposed on a central axis of the aspheric lens, and the vertical side of the first thermal sink is a side of the first thermal sink perpendicular to the TO tube base. Since the vertical side of the first thermal sink is perpendicular to the TO tube base, and the semiconductor laser chip is disposed on the vertical side of the first sink, so that the semiconductor laser chip is perpendicular to the TO tube base; and also since the semiconductor laser chip is disposed on the central axis of the aspheric lens, forward light exiting the semiconductor laser chip is collimated by the aspheric lens and then exits the aspheric lens, and the forward light is perpendicular to the TO tube base. Thus the forward light of the semiconductor laser chip in embodiments of the present disclosure can pass the aspheric lens on the TO tube cap and directly exit perpendicular to the TO tube base; and the forward light of the semiconductor laser chip passing the aspheric lens can exit perpendicular to the TO tube base without passing a right-angled lens, to thereby address such a problem in the packaging structure of the tunable laser device that only after being refracted by the right-angled lens can the forward light of the semiconductor laser chip can exit perpendicularly.

Figure 2:
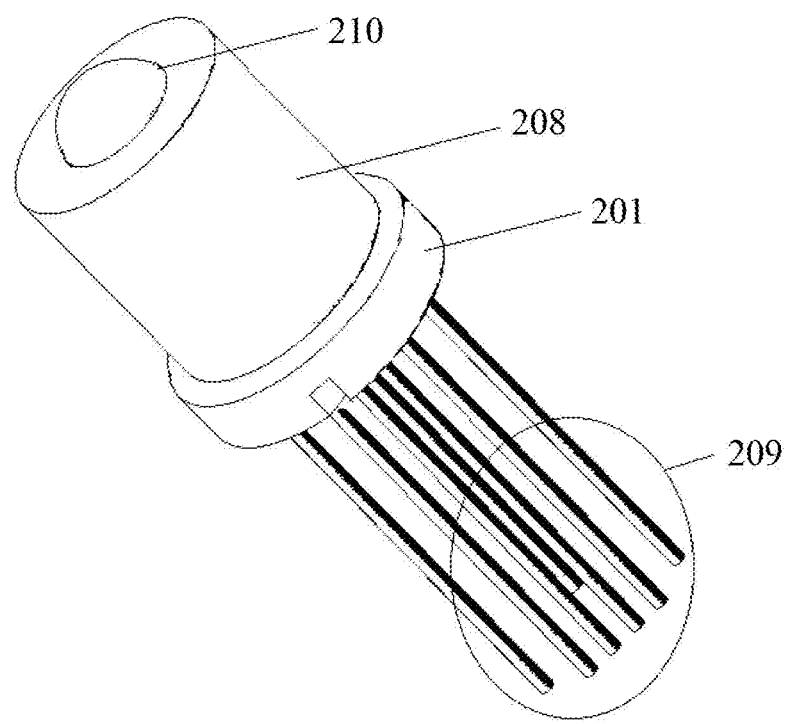
FIG. 2 illustrates a schematic diagram of a packaging structure outside a tunable laser device according to embodiments of the present disclosure.

As illustrated in FIG. 2, an embodiment of the present disclosure provides a packaging structure outside a tunable laser device, and the tunable laser device includes a TO tube base 201 and a TO tube cap 208.

Pins 209 are disposed on the TO tube base 201 to be connectable with an external circuit, to thereby monitor an operating state of the tunable laser device; and an aspheric lens 210 disposed on the TO tube cup 208 can converge forward light, generated by a semiconductor laser chip 205 inside the tunable laser device, into collimated light to be coupled into an optic fiber for transmission.

Figure 3:
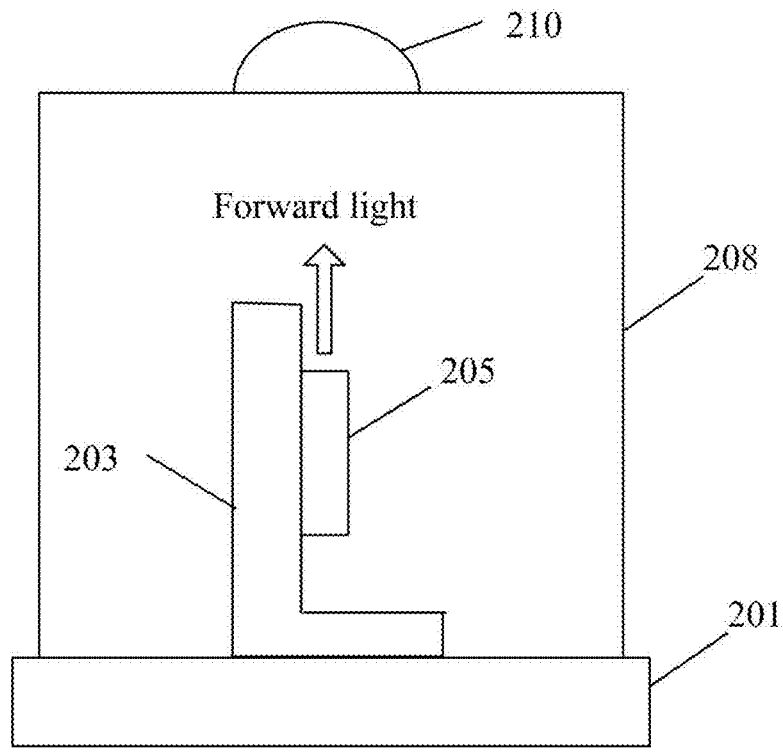
FIG. 3 illustrates a schematic diagram of the packaging structure of the tunable laser device as illustrated in FIG. 2.

FIG. 3 illustrates a schematic diagram of the packaging structure of the tunable laser device as illustrated in FIG. 2. As can be apparent from FIG. 3, a first thermal sink 203 is disposed on the TO tube base 201, the semiconductor laser chip 205 is disposed on a vertical side of the first thermal sink 203, and the semiconductor laser chip 205 is disposed on the central axis of the aspheric lens 210, herein the forward light of the semiconductor laser chip 205 is directed in the direction pointed to by the arrow in FIG. 3, and the vertical side of the first thermal sink 203 is a side of the first thermal sink 203 perpendicular to the TO tube base 201.

The first thermal sink 203 as illustrated in FIG. 3 may be made of metal or ceramic, which can be metalized on the surface thereof, with a thermal conductivity above 180 W/mk and a thermal expansion coefficient below 8*10−6° C. For example, the first thermal sink 203 may be embodied as a tungsten-cooper thermal sink. Since the first thermal sink 203 is provided with a horizontal side and a vertical side respectively, it may be designed in an L-shaped structure, for example. Since the vertical side of the first thermal sink 203 in the L-shaped structure is perpendicular to the TO tube base 201, the semiconductor laser chip 205 is disposed on the vertical side of the first thermal sink 203 in the L-shaped structure, so that the forward light of the semiconductor laser chip 205 may exit perpendicular to the TO tube base 201. Also due to the high thermal conductivity of the first thermal sink 203, the first thermal sink 203 in the L-shaped structure may be further configured to conduct the heat generated by the semiconductor laser chip 205 disposed thereon.

Some embodiments of the present disclosure provide a packaging structure and a method of packaging a tunable laser device, and the packaging structure includes a TO tube base and a TO tube cup, a first thermal sink disposed on the TO tube base, a semiconductor laser chip disposed on a vertical side of the first thermal sink, and an aspheric lens disposed on the TO tube cap, herein the semiconductor laser chip is disposed on a central axis of the aspheric lens, and the vertical side of the first thermal sink is a side of the first thermal sink perpendicular to the TO tube base. Since the vertical side of the first thermal sink is perpendicular to the TO tube base, and the semiconductor laser chip is disposed on the vertical side of the first sink, so that the semiconductor laser chip is perpendicular to the TO tube base; and also since the semiconductor laser chip is disposed on the central axis of the aspheric lens, forward light exiting the semiconductor laser chip is collimated by the aspheric lens and then exits the aspheric lens, and the forward light is perpendicular to the TO tube base. Thus the forward light of the semiconductor laser chip in embodiments of the present disclosure may pass the aspheric lens on the TO tube cap and directly exit perpendicular to the TO tube base; and the forward light of the semiconductor laser chip passing the aspheric lens may exit perpendicular to the TO tube base without passing a right-angled lens, to thereby address such a problem in the packaging structure of the tunable laser device that only after being refracted by the right-angled lens, can the forward light of the semiconductor laser chip exit perpendicularly.

With the tunable laser device according to some embodiments of the present disclosure, the aspheric lens is disposed on the TO tube cup, and thus there is no need to dispose the aspheric lens inside the tunable laser device; and also the tunable laser device according to some embodiments of the present disclosure does not have to be provided with a right-angled lens, so there is no need to dispose the right-angled lens inside the tunable laser device, thus shrinking the package size of the laser device, and reducing the producing cost and the manufacturing difficulty.

The packaging structure of the tunable laser device according to an embodiment of the present disclosure can further include a second thermal sink 204. The semiconductor laser chip 205 is disposed on the second thermal sink 204, and the second thermal sink 204 with the semiconductor laser chip 205 disposed thereon is disposed on the vertical side of the first thermal sink.

The second thermal sink 204 may be made of metal or ceramic, which may be metalized on the surface thereof, with a thermal conductivity above 220 W/mk and a thermal expansion coefficient of approximately 4.5*10–6° C. For example, in an embodiment of the present disclosure, the second thermal sink 204 is made of Aluminum Nitride (ALN). Since the thermal conductivity of the second thermal sink 204 is higher than the thermal conductivity of the first thermal sink 203, the heat generated by the semiconductor laser chip 205 may be conducted from the second thermal sink 204 to the first thermal slink 203 more rapidly; and the contact area of the second thermal sink 204 with the first thermal sink 203 is larger than the contact area of the semiconductor laser chip 205 with the first thermal sink 203, to thereby facilitate heat dissipation of the semiconductor laser chip 205.

Optionally, the first thermal sink 203 and the second thermal sink 204 may be made as large as possible while accommodating the conventional size of the TO package, to thereby improve the efficiency of heat dissipation of the semiconductor laser chip 205; and also the size and the performance of the thermoelectric cooler 202 may be designed to accommodate the small size of the TO package while achieving the optimum cooling efficiency and the lowest power consumption thereof.

Figure 4:
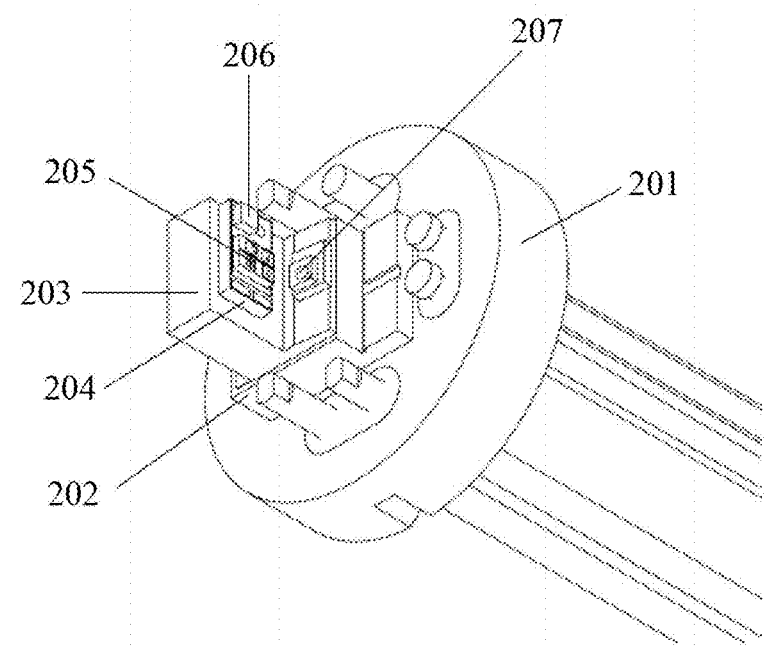
FIG. 4 illustrates a schematic diagram of a packaging structure inside a tunable laser device according to embodiment of the present disclosure.

Optionally, as illustrated in FIG. 4, in order to monitor the power of the forward light exiting the tunable laser device, the packaging structure of the tunable e laser device may further include a backlight monitor 207 disposed on the horizontal side of the first thermal sink 203, herein the horizontal side of the first thermal sink 203 is a side of the first thermal sink parallel to the TO tube base 201.

For example, the backlight monitor 207 may be embodied as a backlight monitor diode configured to monitor the power of the forward light exiting the semiconductor laser chip. After backward light of the semiconductor laser chip 205 is projected onto the backlight monitor diode, the backlight monitor diode may generate light current from the backward light, so that the higher the intensity of the light, the larger the generated light current will be. With reference to the magnitude of the light current and the ratio of the light before existing to the light after existing the semiconductor laser chip 205, the power of the forward light exiting the semiconductor laser chip 205 may be monitored in real time, and the power of the forward light exiting the semiconductor laser chip 205 may be automatically adjusted to the change in current of the backward light.

In order to improve the effect of heat dissipation of the semiconductor laser chip, the packaging structure of the tunable laser device may further include a thermoelectric cooler 202. As illustrated in FIG. 4, the horizontal side of the first thermal sink 203 is disposed on the thermoelectric cooler 202, and the thermoelectric cooler 202 is disposed on the TO tube base 201.

The heat generated by the semiconductor laser chip 205 is conducted to the first thermal sink 203 through the second thermal sink 204, and then to the cool end of the thermoelectric cooler 202 through the first thermal sink 203, so that the heat is conducted to the outside through the TO tube base 201, due to the Peltier effect of the thermoelectric cooler 202. It shall be noted that the Peltier effect refers to such a phenomenon that the cool end of the thermoelectric cooler absorbs heat, and the thermal end thereof releases heat, when DC current passes the thermoelectric cooler. Since the heat is conducted through the material with a high thermal conductivity throughout the thermal conduction process, there is a very small thermal resistance between the semiconductor laser chip 205 and the TO tube base 201, to thereby achieve a high thermal conductivity.

In order to detect in real time a change in temperature of the tunable laser chip, the packaging structure of the tunable laser device may further include a temperature sensor 206. In the packaging structure of the tunable laser device without the second thermal sink 204, the temperature sensor 206 may be disposed on the first thermal sink 203; and in the packaging structure of the tunable laser device including both the first thermal sink 203 and the second thermal sink 204, the temperature sensor 206 may be disposed on the second thermal sink 204. FIG. 4 illustrates the example where the temperature sensor 206 is disposed on the second thermal sink 204.

No matter the temperature sensor 206 is disposed on the first thermal sink 203 or the second thermal sink 204, the distance between the temperature sensor 206 and the semiconductor laser chip 205 may be set between 30 μm and 200 μm. For example, the distance between the temperature sensor 206 and the semiconductor laser chip 205 can be set to be 50 μm, 60 μm, 80 μm, 100 μm, 120 μm or 140 μm. For example, the distance between the semiconductor laser chip 205 and the temperature sensor 206 may be set to be 100 μm in a preferred embodiment of the present disclosure.

In another example, the temperature sensor 206 may be a thermally sensitive resistor. Since the resistance of the thermally sensitive resistor may vary with temperature, so that a different resistance thereof corresponds to different temperature, and the resistance of the thermally sensitive resistor may vary with temperature up to the precision of 1%, the thermally sensitive resistor can be disposed close to the semiconductor laser chip 205, to thereby reflect precisely the change in temperature of the semiconductor laser chip 205.

The temperature of the semiconductor laser chip 205 may further be adjusted by the thermoelectric cooler 202 and the thermally sensitive resistor inside the packaging structure of the tunable laser device, and an Automatic Temperature Control (ATC) circuit outside the packaging structure of the tunable laser device. Since the temperature of the semiconductor laser chip 205 is fed back precisely by the resistance of the thermally sensitive resistor, the ATC circuit may acquire the resistance of the thermally sensitive resistor, to monitor the temperature of the semiconductor laser chip 205, and the ATC circuit may apply current rapidly to the thermoelectric cooler 202 in response to the change in resistance of the thermally sensitive resistor, to thereby stabilize the temperature of the semiconductor laser chip 205 through heating or cooling, so as to stabilize and adjust the temperature thereof.

Figure 5:
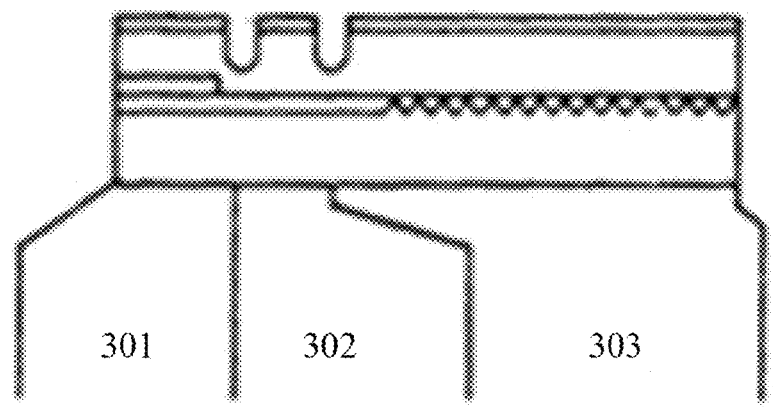
FIG. 5 illustrates a schematic diagram of an inside structure of a semiconductor laser chip in which a DBR is disposed.
Figure 6:
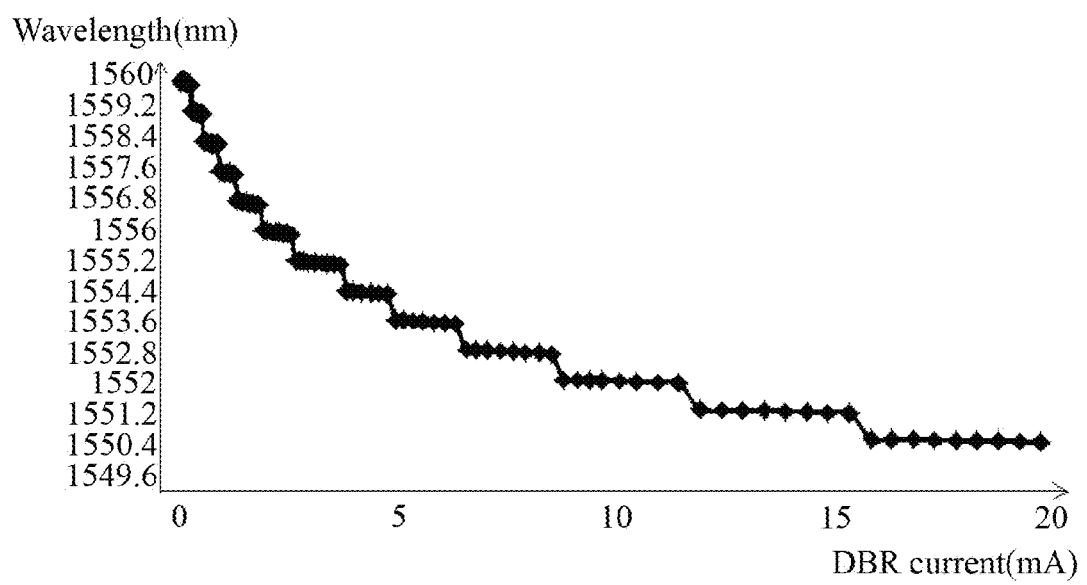
FIG. 6 illustrates a schematic diagram of a correspondence relationship between current injected into the DBR and an output wavelength.

A Distributed Bragg Reflector (DBR) is disposed in the semiconductor laser chip according to the embodiments of the present disclosure. With the characteristic of the DBR, a wavelength may be adjustable continuously, by changing the magnitude of current injected into the DBR and adjusting the temperature of the DBR, herein FIG. 5 illustrates a schematic structural diagram inside a semiconductor laser chip in which a DBR is disposed, and as can be apparent from FIG. 5, the chip generally includes an active area 301, a phase control area 302 and a Bragg reflective grating area 303 (also referred to as a DBR area). The concentration of carriers in the DBR area and the reflectivity thereof will vary, with varying current injected into the DBR area, so that a central wavelength generated therein will vary. As illustrated in FIG. 6, as the current in the DBR area increments, the central wavelength generated by the semiconductor laser chip 205 tends to decrease in a stepped manner by a step of approximately 0.8 nanometer (nm), and this adjustment will be referred to as rough adjustment, due to a significant influence of the variation in change on the variation in output wavelength. Moreover as can be apparent from FIG. 6, the output wavelength decreases at a rate which becomes lower gradually along with the increase of the current, until the current increases to 20 milli-amperes (mA), and then the output wavelength remains substantially constant, so the wavelength can be adjusted by approximately 10 nm through varying the current in the DBR area.

Moreover, with given constant current injected into the DBR area, the active area of the DBR will impose an influence upon the central wavelength generated by the semiconductor laser chip varying with temperature, herein the coefficient of the central wavelength varying with temperature ranges from 0.1 to 0.12 nm/° C., and the ATC circuit can control the temperature to be adjusted to the precision of 0.01° C., so the temperature may be controlled precisely, to thereby control the central wavelength, generated by the tunable laser chip with the DBR disposed therein, to be varied between approximately 0.001 nm to 0.0012 nm, and this adjustment may be referred to as fine adjustment. Since the operating temperature of the tunable laser chip with the DBR disposed therein ranges from 25 to 50° C., the operating temperature of the tunable laser chip with the DBR disposed therein can be tunable between 25 and 50° C., and varied by 25° C. at most, so the temperature can be tunable to thereby adjust the wavelength in the range of approximately 2.5 to 3 nm.

Thus in combination of the rough adjustment and the fine adjustment, the central wavelength of the tunable laser chip with the DBR disposed therein may be adjusted by more than 12 nm, and Table 1 below experimentally depicts an example of a varying central wavelength of an tunable laser device, adjustable at 16 channel wavelengths, as specified in compliance with the International Telecommunication Union (ITU)

TABLE 1

| 16 channels | Frequency (THz) | Wavelength (nm) |
| --- | --- | --- |
| 1 | 192.2 | 1559.79 |
| 2 | 192.3 | 1558.98 |
| 3 | 192.4 | 1558.17 |
| 4 | 192.5 | 1557.36 |
| 5 | 192.6 | 1556.55 |
| 6 | 192.7 | 1555.75 |
| 7 | 192.8 | 1554.94 |
| 8 | 192.9 | 1554.13 |
| 9 | 193.0 | 1553.33 |
| 10 | 193.1 | 1552.52 |
| 11 | 193.2 | 1551.72 |
| 12 | 193.3 | 1550.92 |
| 13 | 193.4 | 1550.12 |
| 14 | 193.5 | 1549.32 |
| 15 | 193.6 | 1548.51 |
| 16 | 193.7 | 1547.72 |

TABLE 1-continued

Figure 7:
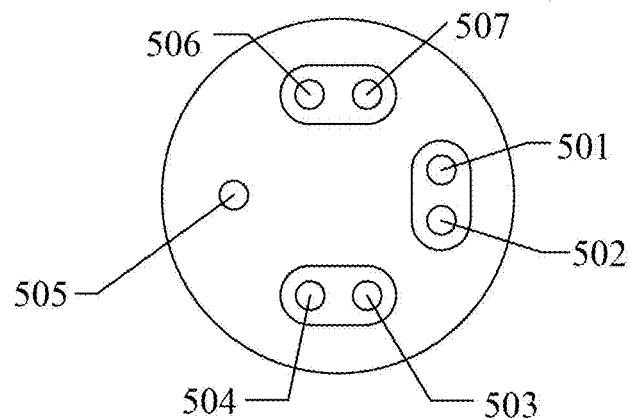
FIG. 7 illustrates a schematic diagram of the disposition of pins of the tunable laser device as illustrated in FIG. 4.

FIG. 7 illustrates a top view of the tunable laser device as illustrated in FIG. 4. As can be apparent from FIG. 7, the tunable laser device includes 7 pines, herein the pin 501 and the pine 502 are respectively connected with an anode and a cathode of the thermoelectric cooler, the pin 503 is connected with a cathode of the backlight monitor diode, the pin 504 is connected with one end of the thermally sensitive resistor, the pin 505 is a grounded pin and can be used as a cathode of the active area of the DBR, a cathode of the grating area of the DBR, an anode of the backlight monitor diode, and the other terminal of the thermally sensitive resistor, the pin 506 is connected with an anode of the active area of the DBR, and the pin 507 is connected with an anode of the grating area of the DBR.

It shall be noted that FIG. 4 illustrates merely a schematic structural diagram inside of an optional tunable laser device according to some embodiments of the present disclosure, and the tunable laser device includes both the first thermal sink and the second thermal sink, so that the heat generated by the semiconductor laser chip may be conducted rapidly to the outside through the first thermal sink and the second thermal sink, to thereby achieve a high thermal conductivity. FIG. 7 illustrates merely a schematic diagram of the disposition of the pins, but the pins may alternatively be disposed otherwise without departing from the scope of embodiments of the disclosure as claimed, optionally at least 8 pins can be included, of which 7 pins may be embodied the same as the pins as illustrated in FIG. 7, and the remaining pin can be used as a reserved pin for later use.

Some embodiments of the present disclosure provide a method of packaging an tunable laser device including a TO tube base, a TO tube cap, a first thermal sink, a semiconductor laser chip, and an aspheric lens, and the method of packaging the tunable laser device includes:

The semiconductor laser chip may be soldered on a vertical side of the first thermal sink through eutectic soldering, herein the vertical side of the first thermal sink is a side of the first thermal sink perpendicular to the TO tube base; the first thermal sink may be soldered on the TO tube base through eutectic soldering; the above soldered components may be connected with pins of the TO tube base through gold-wire soldering; the aspheric lens may be soldered on the TO tube cap; and the TO tube cap soldered with the aspheric lens may be soldered on the TO tube base.

Optionally, the eutectic soldering may be performed by using a gold-tin solder with a melting point of approximately 280° C.; and the TO tube cap may be soldered on the TO tube base, and the TO tube cap may be fused and sealed on the TO tube base using resistance soldering and a solder.

The tunable laser device may further include a thermoelectric cooler, a temperature sensor, and a backlight monitor, and the method of packaging the tunable laser device can include:

The semiconductor laser chip and the temperature sensor are soldered through eutectic soldering on the vertical side of the first thermal sink; the backlight monitor is adhered on a horizontal side of the first thermal sink; the first thermal sink is soldered through eutectic soldering on the thermoelectric cooler; the thermoelectric cooler is soldered through eutectic soldering on the TO tube base; the above soldered components are connected with the pins of the TO tube base through gold-wire solder; the aspheric lens is soldered on the TO tube cup; and the TO tube cup soldered with the aspheric lens is soldered on the TO tube base, herein the vertical side of the first thermal sink is a side of the first thermal sink perpendicular to the TO tube base, and the horizontal side of the first thermal sink is a side of the first thermal sink parallel to the TO tube base.

Optionally, the backlight monitor may be adhered on the horizontal side of the first thermal sink through a silver adhesive.

When the tunable laser device further includes a second thermal sink, the method of packaging the tunable laser device may include:

The semiconductor laser chip and the temperature sensor are soldered through eutectic soldering on the second thermal sink; the second thermal sink is soldered through eutectic soldering on the vertical side of the first thermal sink, and the backlight monitor is adhered on the horizontal side of the first thermal sink; the first thermal sink is soldered through eutectic soldering on the thermoelectric cooler; the thermoelectric cooler is soldered through eutectic soldering on the TO tube base; the above soldered components are connected with the pins of the TO tube base through gold-wire solder; and the TO tube cup is soldered on the TO tube base, herein the vertical side of the first thermal sink is a side of the first thermal sink perpendicular to the TO tube base, and the horizontal side of the first thermal sink is a side of the first thermal sink parallel to the TO tube base.

Moreover, some embodiments of the present disclosure further provide an tunable laser device including a packaging structure which may include a TO tube base and a TO tube cap, herein a first thermal sink is disposed on the TO tube base, a semiconductor laser chip is disposed on a vertical side of the first thermal sink, an aspheric lens is disposed on the TO tube cap, and the semiconductor laser chip is disposed on a central axis of the aspheric lens; and herein the vertical side of the first thermal sink is a side of the first thermal sink perpendicular to the TO tube base.

Optionally, the packaging structure above may further include a second thermal sink, herein the semiconductor laser chip is disposed on the second thermal sink, and the second think is disposed on the vertical side of the first thermal sink.

Optionally, the packaging structure above may further include a backlight monitor disposed on a horizontal side of the first thermal sink, which is a side of the first thermal sink parallel to the TO tube base.

Optionally, the packaging structure above may further include a thermoelectric cooler, herein the horizontal side of the first thermal sink is disposed on the thermoelectric cooler, and the thermoelectric cooler is disposed on the TO tube base.

Optionally, the packaging structure above may further include a temperature sensor disposed on the first thermal sink.

Optionally, the packaging structure above may further include at least 7 pins disposed on the TO tube base.

Figure 8:
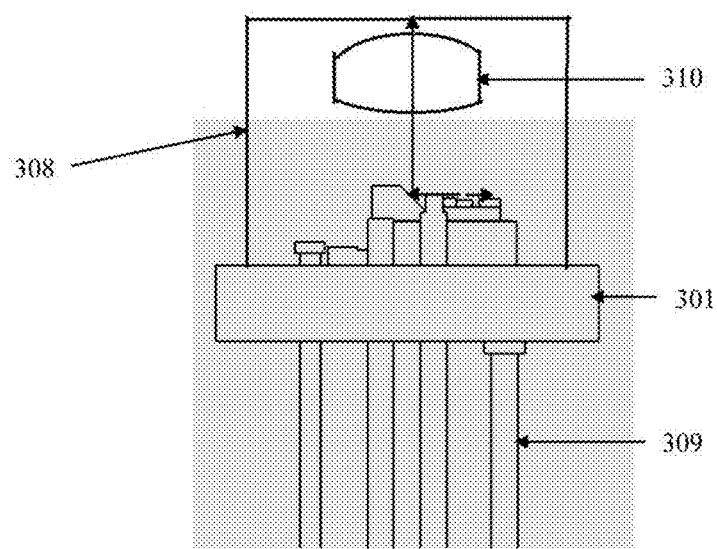
FIG. 8 illustrates a schematic diagram of another packaging structure outside a tunable laser device according to embodiments of the present disclosure.

As illustrated in FIG. 8, some embodiments of the present disclosure provide another packaging structure outside a tunable laser device, and the tunable laser device includes a TO tube base 301 and a TO tube cap 308.

Pins 309 are disposed on the TO tube base 301 to be connectable with an external circuit, to thereby monitor an operating state of the tunable laser device; and an aspheric lens 310 disposed on the TO tube cup 308 can converge forward light, generated by a semiconductor laser chip inside the tunable laser device, into collimated light to be coupled into an optic fiber for transmission.

Figure 9:
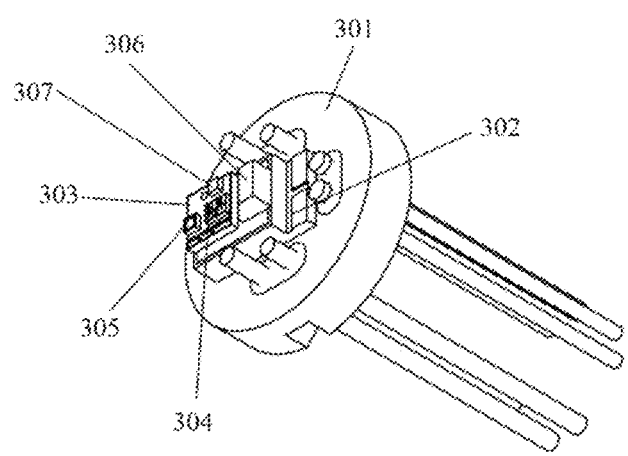
FIG. 9 illustrates a schematic diagram of another packaging structure inside a tunable laser device according to embodiment of the present disclosure.

As illustrated in FIG. 9, some embodiments of the present disclosure provide another packaging structure outside a tunable laser device, and the packaging structure includes a TO tube base and a TO tube cap; a thermoelectric cooler 302 is disposed on the TO tube base 301; a thermal sink with high thermal conductivity 303 and a reflector with an angle of 45 degrees 306 are disposed on the thermoelectric cooler 302; a semiconductor laser chip 304, a backlight monitor diode 305 and a thermally sensitive resistor 307 are disposed on the thermal sink with high thermal conductivity 303; the semiconductor laser chip 304 is arranged parallel to the TO tube base 301.

Particularly, an external diameter of the TO tube base is ranging from 5.6 to 12 millimeters, and the number of pins of the TO tube base is ranging from 6 to 12; the TO tube cap is a flat window tube cap or a non-spherical tube cap.

Some embodiments of the present disclosure provide another method of packaging a tunable laser device, the tunable laser device includes: a TO tube base, and a TO tube cap, a thermoelectric cooler, a thermal sink with high thermal conductivity, a reflector with an angle of 45 degrees, a semiconductor laser chip, a backlight monitor diode, a thermally sensitive resistor, and an aspheric lens, the packaging method includes:

Adhering the thermoelectric cooler 302 on the TO tube base 301 through eutectic soldering or high thermal conductivity glue; adhering the thermal sink with high thermal conductivity 303 and the reflector with an angle of 45 degrees 306 on the thermoelectric cooler 302 through eutectic soldering or high thermal conductivity glue; adhering the semiconductor laser chip 304, the backlight monitor diode 305 and the thermally sensitive resistor 307 on the thermal sink 303 through eutectic soldering or high thermal conductivity glue; soldering the flat window tube cap or a non-spherical tube cap 308 on the TO tube base 301 through resistance welding.

Furthermore, some embodiments of the present disclosure provide another tunable laser device including a packaging structure, the packaging structure includes a TO tube base and a TO tube cap; a thermoelectric cooler is disposed on the TO tube base; a thermal sink and a reflector with an angle of 45 degrees are disposed on the thermoelectric cooler; a semiconductor laser chip, a backlight monitor and a temperature sensor are disposed on the thermal sink; an aspheric lens is disposed on the TO tube cap; a Distributed Bragg Reflector is disposed in the semiconductor laser chip; and the semiconductor laser chip is arranged parallel to the TO tube base.

Optionally, the thermal sink is a thermal sink with high thermal conductivity, the backlight monitor is a backlight monitor diode, and the temperature sensor is a thermally sensitive resistor.

Optionally, an external diameter of the TO tube base is ranging from 5.6 to 12 millimeters, and the number of pins of the TO tube base is ranging from 6 to 12; the TO tube cap is a flat window tube cap or a non-spherical tube cap.

Optionally, a distance between the temperature sensor and the semiconductor laser chip is set between 30 μm and 200 μm.

In the tunable laser device, the semiconductor laser chip is arranged parallel to the TO tube base, and the laser light emitted from the semiconductor laser chip is reflected by the reflector with an angle of 45 degrees to the aspheric lens, and then output from the aspheric lens, where the wavelength and temperature are adjusted as described above.

Lastly, it shall be noted that embodiments above are merely illustrative the technical solutions of the present disclosure but not intended to limit them; and although the present disclosure has been described in details with reference to embodiments above, those ordinarily skilled in the art shall appreciate that they can modify the technical solutions according to the respective embodiments above or make equivalent substitutions to a part of the technical features thereof; and these modifications or substitutions can be made to the respective technical solutions without departing from the spirit and scope of the technical solutions according to the respective embodiments of the present disclosure.

The invention claimed is:

1. A packaging structure of a tunable laser device, comprising:
   a TO tube base;
   a TO tube cap;
   a thermoelectric cooler disposed on the TO tube base;
   a first thermal sink disposed on the thermoelectric cooler;
   a semiconductor laser chip, a backlight monitor and a temperature sensor, disposed on the first thermal sink;
   an aspheric lens disposed on the TO tube cap; and
   a Distributed Bragg Reflector disposed in the semiconductor laser chip.

2. The packaging structure according to claim 1, wherein the first thermal sink comprises a horizontal side and a vertical side, the horizontal side of the first thermal sink is disposed on the thermoelectric cooler, the semiconductor laser chip is disposed on the vertical side of the first thermal sink, and the semiconductor laser chip is disposed on a central axis of the aspheric lens, wherein the vertical side of the first thermal sink is perpendicular to the TO tube base, and the horizontal side of the first thermal sink is parallel to the TO tube base.

3. The packaging structure according to claim 2, wherein the packaging structure further comprises: a second thermal sink, wherein the semiconductor laser chip is disposed on the second thermal sink, and the second thermal sink is disposed on the vertical side of the first thermal sink.

4. The packaging structure according to claim 2, wherein the backlight monitor is disposed on the horizontal side of the first thermal sink, and the temperature sensor is disposed on the vertical side of the first thermal sink.

5. The packaging structure according to claim 3, wherein the temperature sensor is disposed on the second thermal sink.

6. The packaging structure according to claim 1, wherein the first thermal sink comprises a horizontal side, the horizontal side of the first thermal sink is parallel to the TO tube base, the packaging structure further comprises a reflector with an angle of 45 degrees disposed on the thermoelectric cooler, the semiconductor laser chip is disposed on the horizontal side of the first thermal sink, and the semiconductor laser chip is arranged parallel to the TO tube base, wherein the laser light emitted from the semiconductor laser chip is reflected by the reflector with an angle of 45 degrees to the aspheric lens.

7. The packaging structure according to claim 1, wherein the first thermal sink is a thermal sink with high thermal conductivity, the backlight monitor is a backlight monitor diode, and the temperature sensor is a thermally sensitive resistor.

8. The packaging structure according to claim 1, wherein an external diameter of the TO tube base is ranging from 5.6 to 12 millimeters, and the number of pins of the TO tube base is ranging from 6 to 12; the TO tube cap is a flat window tube cap or a non-spherical tube cap.

9. The packaging structure according to claim 1, a distance between the temperature sensor and the semiconductor laser chip is set between 30 µm and 200 µm.

10. A method of packaging a tunable laser device comprising a semiconductor laser chip, a thermoelectric cooler, a first thermal sink, a backlight monitor, a temperature sensor, an aspheric lens, a TO tube base, and a TO tube cap, and a Distributed Bragg Reflector disposed in the semiconductor laser chip, the method comprising:
   adhering the thermoelectric cooler on the TO tube base through eutectic soldering or high thermal conductivity glue;
   adhering the first thermal sink on the thermoelectric cooler through eutectic soldering or high thermal conductivity glue;
   adhering the semiconductor laser chip, the backlight monitor and the temperature sensor on the first thermal sink through eutectic soldering or high thermal conductivity glue;
   connecting above components with pins of the TO tube base through gold-wire soldering;
   soldering the aspheric lens on the TO tube cap; and
   soldering the TO tube cap soldered with the aspheric lens on the TO tube base through resistance welding.

11. The packaging method according to claim 10, wherein the first thermal sink comprises a horizontal side and a vertical side, the vertical side of the first thermal sink is perpendicular to the TO tube base, and the horizontal side of the first thermal sink is parallel to the TO tube base, adhering the semiconductor laser chip, the backlight monitor and the temperature sensor on the first thermal sink through eutectic soldering or high thermal conductivity glue comprises:
   soldering the semiconductor laser chip on the vertical side of the first thermal sink;
   soldering the temperature sensor on the vertical side of the first thermal sink;
   adhering the backlight monitor on the horizontal side of the first thermal sink.

12. The packaging method according to claim 11, wherein the tunable laser device further comprises a second thermal sink; and
   the soldering the temperature sensor on the vertical side of the first thermal sink comprises:
   soldering the temperature sensor on the second thermal sink; and soldering the second thermal sink on the vertical side of the first thermal sink.

13. The packaging method according to claim 10, wherein the first thermal sink comprises a horizontal side, the horizontal side of the first thermal sink is parallel to the TO tube base, adhering the semiconductor laser chip, the backlight monitor and the temperature sensor on the first thermal sink through eutectic soldering or high thermal conductivity glue comprises:
   adhering the semiconductor laser chip, the backlight monitor and the temperature sensor on the horizontal side of the first thermal sink through eutectic soldering or high thermal conductivity glue;
   wherein the packaging structure further comprises a reflector with an angle of 45 degrees, and the method further comprises:
   adhering the reflector with an angle of 45 degrees on the thermoelectric cooler through eutectic soldering or high thermal conductivity glue.

* * * * *